US012772465B2

(12) United States Patent
Yotsuda

(10) Patent No.: US 12,772,465 B2
(45) Date of Patent: Oct. 20, 2026

(54) CAPACITOR AND METHOD OF MANUFACTURING SAME

(71) Applicant: Sumitomo Electric Device Innovations, Inc., Yokohama (JP)

(72) Inventor: Yasuyo Yotsuda, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 709 days.

(21) Appl. No.: 18/108,924

(22) Filed: Feb. 13, 2023

(65) Prior Publication Data

US 2023/0282686 A1 Sep. 7, 2023

(30) Foreign Application Priority Data

Mar. 7, 2022 (JP) ................................ 2022-034091

(51) Int. Cl.
*H10D 1/00* (2025.01)
*H10D 1/68* (2025.01)

(52) U.S. Cl.
CPC ............ *H10D 1/041* (2025.01); *H10D 1/696* (2025.01)

(58) Field of Classification Search
CPC ........... H10D 1/60; H10D 1/68; H10D 1/692; H10D 1/696; H10D 1/714; H10D 1/684; H10D 1/716; H10D 1/041; H01L 23/5222; H01L 23/5223; H01L 21/302; H01L 21/31122; H01L 23/642; H10W 20/046; H10W 20/495; H10W 20/496
See application file for complete search history.

(56) References Cited

U.S. PATENT DOCUMENTS 7,439,151 B2 * 10/2008 Coolbaugh ............ H10D 1/692 438/389
10,050,102 B2 * 8/2018 Chang .................... H10D 1/692
(Continued)

FOREIGN PATENT DOCUMENTS

JP 2006210018 A 8/2006
JP 2007149827 A 6/2007
(Continued)

OTHER PUBLICATIONS

Non-Final Office Action issued Aug. 29, 2024 for U.S. Appl. No. 17/690,333.
(Continued)

*Primary Examiner* — Eduardo A Rodela
(74) *Attorney, Agent, or Firm* — Volpe Koenig

(57) ABSTRACT

A capacitor includes a substrate, a first electrode provided on the substrate, a dielectric film provided on the first electrode, a second electrode provided on the dielectric film and having an outer periphery positioned inside the outer periphery of the first electrode in a plan view viewed from above in a direction normal to an upper surface of the substrate, a third electrode that is in contact with the second electrode in a region inside the second electrode in the plan view, is separated upward from the first electrode and the dielectric film outside the region in the plan view, and has an outer periphery positioned inside the outer periphery of the first electrode and an outer periphery of the dielectric film in the plan view, and a protective film covering the second electrode and the third electrode and being in contact with the second electrode and the third electrode.

11 Claims, 13 Drawing Sheets

(56) References Cited

U.S. PATENT DOCUMENTS

| | | | | |
|---|---|---|---|---|
| 10,833,004 | B2 * | 11/2020 | El-Hinnawy | H10N 70/8613 |
| 11,527,542 | B2 * | 12/2022 | Yeong | H10B 12/31 |
| 11,594,593 | B2 * | 2/2023 | Lin | H01L 21/0234 |
| 11,670,580 | B2 * | 6/2023 | Mignot | H01L 23/5223 257/532 |
| 12,137,572 | B2 * | 11/2024 | Wei | H10D 1/688 |
| 12,327,689 | B2 * | 6/2025 | Matsubara | H01G 4/008 |
| 2004/0079980 | A1 * | 4/2004 | Hieda | H10D 1/696 257/E27.048 |
| 2007/0122992 | A1 | 5/2007 | Mizuno et al. | |
| 2007/0253144 | A1 | 11/2007 | Kuwajima | |
| 2013/0062733 | A1 * | 3/2013 | Summerfelt | H10B 53/30 257/532 |
| 2013/0194714 | A1 | 8/2013 | Nakaiso et al. | |
| 2017/0077079 | A1 | 3/2017 | Lan et al. | |
| 2018/0012954 | A1 * | 1/2018 | Kurachi | H10D 1/692 |
| 2018/0061697 | A1 * | 3/2018 | Yamada | H01L 21/76846 |
| 2021/0327888 | A1 | 10/2021 | Wang et al. | |
| 2022/0059290 | A1 | 2/2022 | Matsubara et al. | |
| 2022/0302246 | A1 * | 9/2022 | Igarashi | H01G 4/33 |
| 2022/0376036 | A1 * | 11/2022 | Matsubara | H01G 4/005 |

FOREIGN PATENT DOCUMENTS

| | | | |
|---|---|---|---|
| JP | 2018-6620 | A | 1/2018 |
| WO | 2012/036017 | A1 | 3/2012 |

OTHER PUBLICATIONS

Chinese Office Action issued on Apr. 16, 2026 for Chinese Patent Application No. 202210245423.4.

* cited by examiner

CAPACITOR AND METHOD OF MANUFACTURING SAME

CROSS REFERENCE TO RELATED APPLICATIONS

This application claims priority based on Japanese Patent Application No. 2022-034091 filed on Mar. 7, 2022, and the entire contents of the Japanese patent applications are incorporated herein by reference.

FIELD

The present disclosure relates to a capacitor and a method of manufacturing the same.

BACKGROUND

There is known a capacitor in which a first electrode, a dielectric film and a second electrode are laminated on a substrate. It is known that a third electrode used, for example, as a wiring is formed on a second electrode (for example, Patent Document 1: Japanese Patent Application Laid-Open No. 2018-6620). The third electrode is in contact with the second electrode in the vicinity of the center of the second electrode, and is separated from the second electrode in the vicinity of the outer periphery of the second electrode.

SUMMARY

A capacitor according to the present disclosure includes: a substrate; a first electrode provided on the substrate; a dielectric film provided on the first electrode; a second electrode provided on the dielectric film and having an outer periphery positioned inside the outer periphery of the first electrode in a plan view viewed from above in a direction normal to an upper surface of the substrate; a third electrode that is in contact with the second electrode in a region inside the second electrode in the plan view, is separated upward from the second electrode and the dielectric film outside the region in the plan view, and has an outer periphery positioned inside the outer periphery of the first electrode and an outer periphery of the dielectric film in the plan view; and a protective film covering the second electrode and the third electrode and being in contact with the second electrode and the third electrode.

A method of manufacturing a capacitor according to the present disclosure includes: forming a first electrode on a substrate; forming a dielectric film on the first electrode; forming a second electrode on the dielectric film, the second electrode having an outer periphery positioned inside the outer periphery of the first electrode in a plan view viewed from above in a direction normal to an upper surface of the substrate; forming a third electrode that is in contact with the second electrode in a region inside the second electrode in the plan view, is separated upward from the second electrode and the dielectric film outside the region in the plan view, and has an outer periphery positioned inside the outer periphery of the first electrode and an outer periphery of the dielectric film in the plan view; removing an unnecessary layer formed on an upper surface of the third electrode in a state where an upper surface of the dielectric film outside the outer periphery of the second electrode in the plan view is exposed; and forming a protective film covering the second electrode and the third electrode and being in contact with the second electrode and the third electrode after removing the unnecessary layer.

DETAILED DESCRIPTION OF EMBODIMENTS

Figure 1:
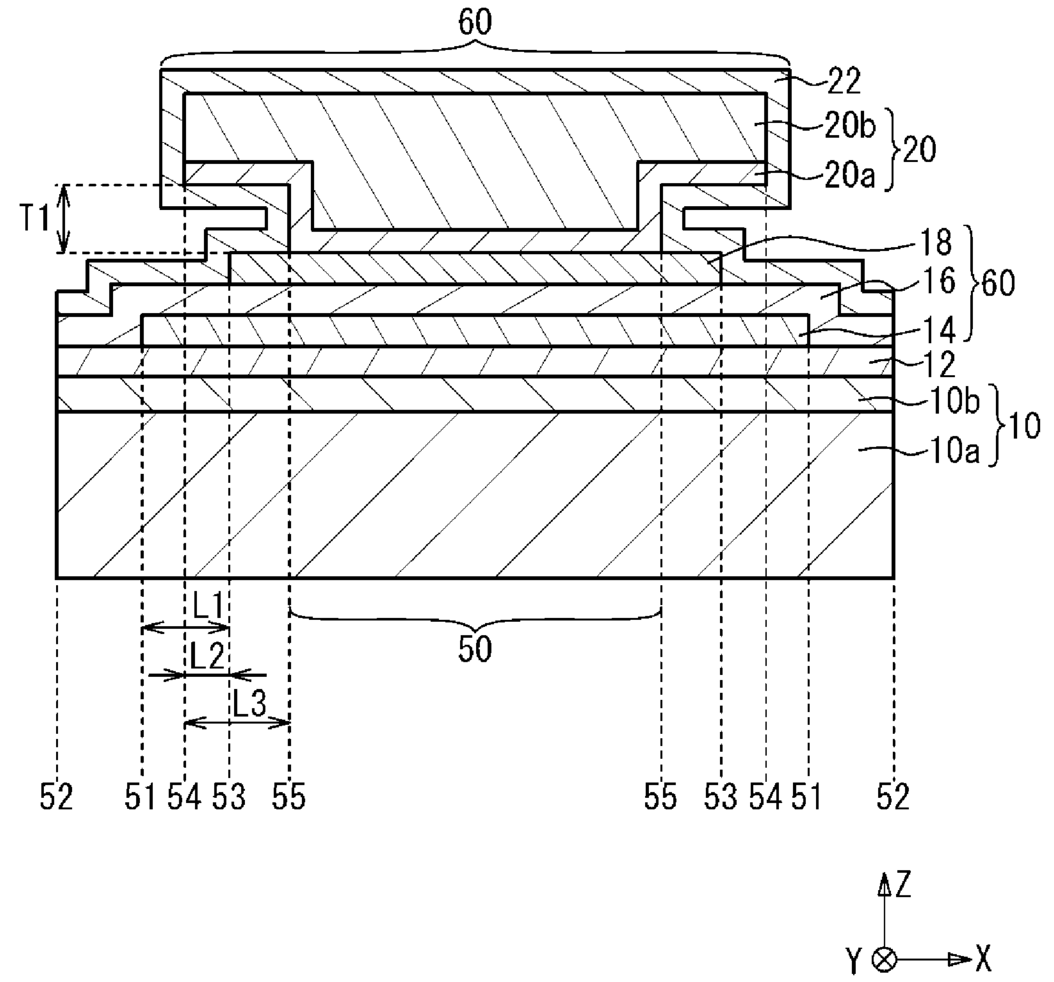
FIG. 1 is a cross-sectional view of a capacitor according to a first embodiment.

In the Patent Document 1, the breakdown voltage of the capacitor may become low.

The present disclosure has been made in view of the above problems, and an object of the present disclosure is to provide a capacitor and a method of manufacturing the same capable of improving the breakdown voltage.

DESCRIPTION OF EMBODIMENTS OF THE PRESENT DISCLOSURE

First, the contents of the embodiments of this disclosure are listed and explained.

(1) A capacitor according to the present disclosure includes: a substrate; a first electrode provided on the substrate; a dielectric film provided on the first electrode; a second electrode provided on the dielectric film and having an outer periphery positioned inside the outer periphery of the first electrode in a plan view viewed from above in a direction normal to an upper surface of the substrate; a third electrode that is in contact with the second electrode in a region inside the second electrode in the plan view, is separated upward from the second electrode and the dielectric film outside the region in the plan view, and has an outer periphery positioned inside the outer periphery of the first electrode and an outer periphery of the dielectric film in the plan view; and a protective film covering the second electrode and the third electrode and being in contact with the second electrode and the third electrode. Thus, the breakdown voltage can be improved.

(2) A distance between the outer periphery of the third electrode and the outer periphery of the second electrode in the plan view may be 0.5 times or more a thickness of the dielectric film.

(3) A distance between the outer periphery of the third electrode and the outer periphery of the second electrode in the plan view may be 0.3 times or more a height between the outer periphery of a lower surface of the third electrode parallel to the upper surface of the substrate and an upper surface of the second electrode as viewed from a plane direction of the upper surface of the substrate.

(4) A height of the outer periphery of a lower surface of the third electrode parallel to the upper surface of the substrate and an upper surface of the second electrode as viewed from a plane direction of the upper surface of the substrate may be 0.5 times or more a distance between the outer periphery of the third electrode and an outer periphery of the region in the plan view.

(5) A thickness of the protective film on the third electrode may be the same as that of the protective film on the second electrode.

(6) The third electrode may include a seed layer provided on the second electrode and a plating layer provided on the seed layer.

(7) A method of manufacturing a capacitor according to the present disclosure includes: forming a first electrode on a substrate; forming a dielectric film on the first electrode; forming a second electrode on the dielectric film, the second electrode having an outer periphery positioned inside the outer periphery of the first electrode in a plan view viewed from above in a direction normal to an upper surface of the substrate; forming a third electrode that is in contact with the second electrode in a region inside the second electrode in the plan view, is separated upward from the second electrode and the dielectric film outside the region in the plan view, and has an outer periphery positioned inside the outer periphery of the first electrode and an outer periphery of the dielectric film in the plan view; removing an unnecessary layer formed on an upper surface of the third electrode in a state where an upper surface of the dielectric film outside the outer periphery of the second electrode in the plan view is exposed; and forming a protective film covering the second electrode and the third electrode and being in contact with the second electrode and the third electrode after removing the unnecessary layer. Thus, the breakdown voltage can be improved.

(8) The removing the unnecessary layer may include irradiating an upper surface of the third electrode with ions or atoms in the state where the upper surface of the dielectric film outside the outer periphery of the second electrode in the plan view is exposed.

(9) The forming the third electrode may include: forming a first mask layer having a first opening on the second electrode; forming a seed layer on an inner surface of the first opening and on the first mask layer; forming a second mask layer having a second opening larger than the first opening on the seed layer; forming a plating layer in the second opening; removing the second mask layer; removing the seed layer using the plating layer as a mask; and removing the first mask layer.

DETAILS OF EMBODIMENTS OF THE PRESENT DISCLOSURE

Specific examples of a high frequency circuit in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
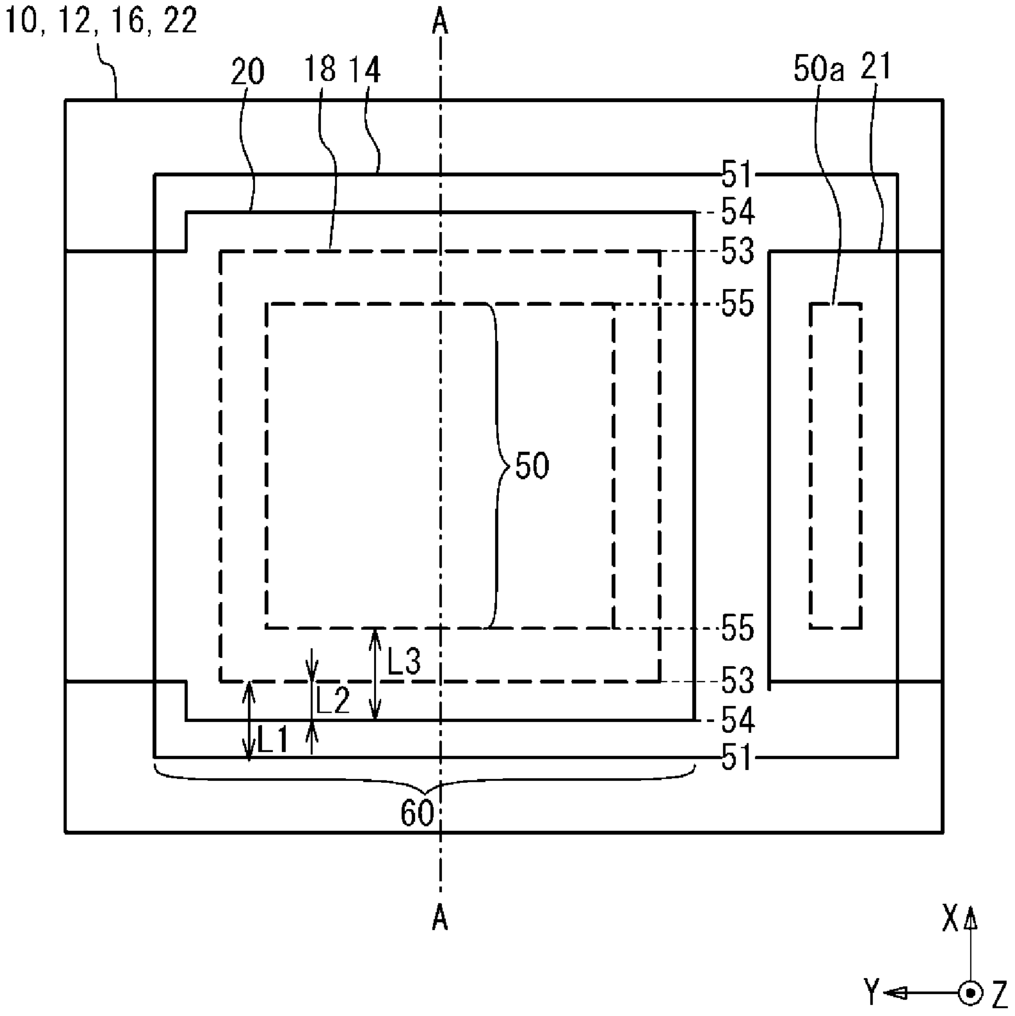
FIG. 2 is a plan view of the capacitor according to the first embodiment.

FIG. 1 is a cross-sectional view of a capacitor according to the first embodiment. FIG. 2 is a plan view of the capacitor according to the first embodiment. FIG. 1 is a sectional view taken along the line A-A of FIG. 2. In FIG. 2, a first electrode 14, a second electrode 18, a third electrode 20 and a region 50 are mainly illustrated. A normal direction of an upper surface of a substrate 10 is defined as a Z direction, and directions parallel to the upper surface of the substrate 10 are defined as an X direction and a Y direction.

As illustrated in FIG. 1, the substrate 10 includes a substrate 10*a* and a semiconductor layer 10*b* provided on the substrate 10*a*. The semiconductor layer 10*b* is, for example, a GaN-based semiconductor layer or a GaAs-based semiconductor layer. When the semiconductor layer 10*b* is the GaN-based semiconductor layer, the substrate 10 is, for example, a SiC substrate, a sapphire substrate, a silicon substrate, or a GaN substrate, and the semiconductor layer 10*b* includes a layer composed of GaN, AlN, InN, or a mixed crystal thereof. When the semiconductor layer 10*b* is the GaAs-based semiconductor layer, the substrate 10*a* is, for example, a GaAs substrate, and the semiconductor layer 10*b* includes a layer composed of GaAs, AlAs, InAs, or a mixed crystal thereof. The semiconductor layer 10*b* in the region where the capacitor is provided is inactivated by ion implantation or the like. A transistor using the semiconductor layer 10*b* may be provided on the substrate 10, and the capacitor and the transistor may be integrated on the same substrate 10 to form an MMIC (Monolithic Microwave Integrated Circuit). The semiconductor layer 10*b* may not be provided on the substrate 10, and an active device such as the transistor may not be provided on the substrate 10.

An insulator film 12 is provided on the substrate 10. The insulator film 12 is, for example, an inorganic insulator film such as a silicon nitride film, a silicon oxide film or a silicon oxynitride film, or an organic insulator film such as polyimide or BCB (Benzocyclobutene) resin. The thickness of the insulator film 12 is, for example, 100 nm to 1200 nm. The first electrode 14 is provided on the insulator film 12 on the substrate 10. A dielectric film 16 is provided on the first electrode 14. The second electrode 18 is provided on the dielectric film 16. An MIM (Metal Insulator Metal) capacitor 60 is formed by the first electrode 14, the dielectric film 16 and the second electrode 18.

A distance between the first electrode 14 and the second electrode 18 through the dielectric film 16 (i.e., the thickness of the dielectric film 16) is substantially uniform to a degree of manufacturing error. In a plan view viewed from above in the Z direction (the direction normal to the upper surface of the substrate 10), an outer periphery 51 of the first electrode 14 is positioned outside an outer periphery 53 of the second electrode 18. An outer periphery 52 of the dielectric film 16 is positioned outside the outer periphery 51 of the first electrode 14. The first electrode 14 and the second electrode 18 are metal films including, for example, an adhesion film and a low-resistance film provided on the adhesion film. The adhesion film may be, for example, a Ti film, a WSi film, a TiW film, a TiWN film or a TiN film. The low-resistance film is made of a material having a resistivity lower than that of the adhesion film and is, for example, an Au film. The thickness of the adhesion film is, for example, 3 nm to 300 nm. The adhesive film may not be provided. The thickness of the low-resistance film is, for example, 50 nm to 400 nm. The dielectric film 16 is, for example, an inorganic insulator film such as a silicon nitride film, a silicon oxide film, or a silicon oxynitride film. From the viewpoint of increasing the dielectric constant, the dielectric film 16 is preferably a silicon nitride film. The thickness of the dielectric film 16 is, for example, 50 nm to 400 nm. The thickness of the dielectric film 16 is set in consideration of the capacitance value and the breakdown voltage of the MIM capacitor 60.

The third electrode 20 is provided on the second electrode 18. The third electrode 20 is in contact with the second electrode 18 in the region 50. An outer periphery 55 of the region 50 is located inside the outer periphery 53 of the second electrode 18. Outside the region 50, the third electrode 20 is spaced above the second electrode 18 and the dielectric film 16. Thus, the third electrode 20 has an eaves at the peripheral edge. The outer periphery 54 of the third electrode 20 is positioned outside the outer periphery 53 of the second electrode 18. The third electrode 20 includes a seed layer 20*a* and a plating layer 20*b* provided on the seed layer 20*a*, which are directed from the second electrode 18 upward. The seed layer 20*a* is, for example, a metal film including an adhesion film and a low-resistance film provided on the adhesion film. The adhesion film may be, for example, a Ti film, a WSi film, a TiW film, a TiWN film or a TiN film. The low-resistance film is made of a material having a resistivity lower than that of the adhesion film and is, for example, an Au film. The thickness of the adhesion film is, for example, 3 nm to 400 nm. The adhesive film may not be provided. The thickness of the low-resistance film is, for example, 50 nm to 200 nm. The plating layer 20*b* is a metal film made of the same material as the low-resistance film, for example, an Au film. The thickness of the plating layer 20*b* is, for example, 1 μm to 6 μm.

A protective film 22 is provided so as to cover an upper surface of the dielectric film 16, an upper surface of the second electrode 18, and the third electrode 20. The protective film 22 is, for example, a silicon nitride film, a silicon oxide film or a silicon oxynitride film. From the viewpoint of the function to be protected, it is preferable to use a silicon nitride film as the protective film 22. The thickness of the protective film 22 is, for example, 30 nm to 800 nm.

As illustrated in FIG. 2, the first electrode 14 is provided larger on a negative side in the Y direction than a region where the MIM capacitor 60 is provided. On the negative side of the MIM capacitor 60 in the Y direction, an electrode 21 is provided on the upper surface of the first electrode 14. The electrode 21 is in contact with the first electrode 14 in a region 50*a*. The electrode 21 includes the seed layer 20*a* and the plating layer 20*b* that are the same as those of the third electrode 20, and is formed simultaneously with the third electrode 20. The third electrode 20 in contact with the second electrode 18 is provided larger on the positive side in the Y direction than the region where the MIM capacitor 60 is provided. The third electrode 20 and the electrode 21 function as wirings for electrically connecting the second electrode 18 and the first electrode 14 to another elements, respectively.

In a region other than the region in which the first electrode 14 is extended on the negative side in the Y direction and the region in which the third electrode 20 is extended on the positive side in the Y direction, the outer periphery 51 of the first electrode 14 is positioned outside the outer periphery 53 of the second electrode 18. The outer periphery 55 of the region 50 is positioned inside the outer periphery 53 of the second electrode 18. The outer periphery 54 of the third electrode 20 is positioned outside the outer periphery 53 of the second electrode 18. A distance between the outer peripheries 51 and 53 is L1, a distance between the outer peripheries 54 and 53 is L2, and a distance between the outer peripheries 54 and 55 is L3. The distance L1 is, for example, 1 μm to 10 μm, the distance L2 is, for example, 0.1 μm to 3 μm, and the distance L3 is, for example, 0.2 μm to 5 μm. In FIG. 1, a height T1 between the outer periphery of the lower surface of the third electrode 20 and the upper surface of the second electrode 18 as viewed from the X direction or the Y direction (i.e., a plane direction of the upper surface of the substrate 10) is, for example, 0.05 μm to 1 μm. When the side surfaces of the first electrode 14, the dielectric film 16, the second electrode 18, and the third electrode 20 are not perpendicular to the upper surface of the substrate 10 (for example, when the side surfaces are inclined or include curves), the outer peripheries 51 to 54 correspond to the outermost positions of the corresponding side surfaces in the plan view.

[Manufacturing Method of First Embodiment]

Figure 3A:
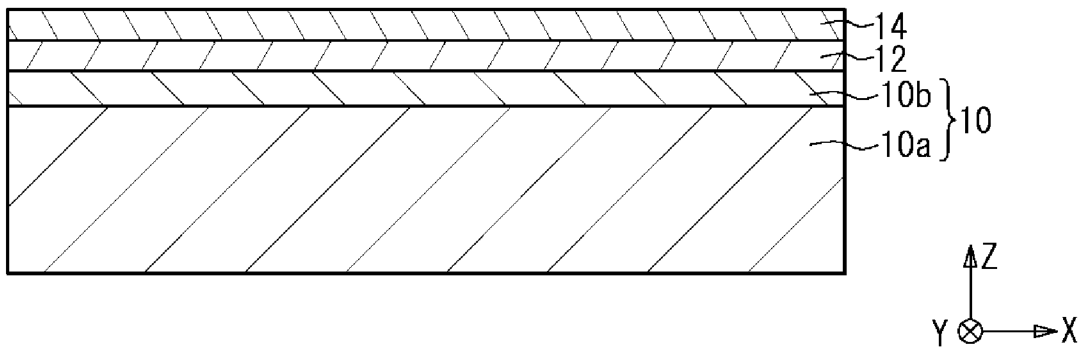
FIG. 3A is a cross-sectional view illustrating a method of manufacturing the capacitor according to the first embodiment.
Figure 3B:
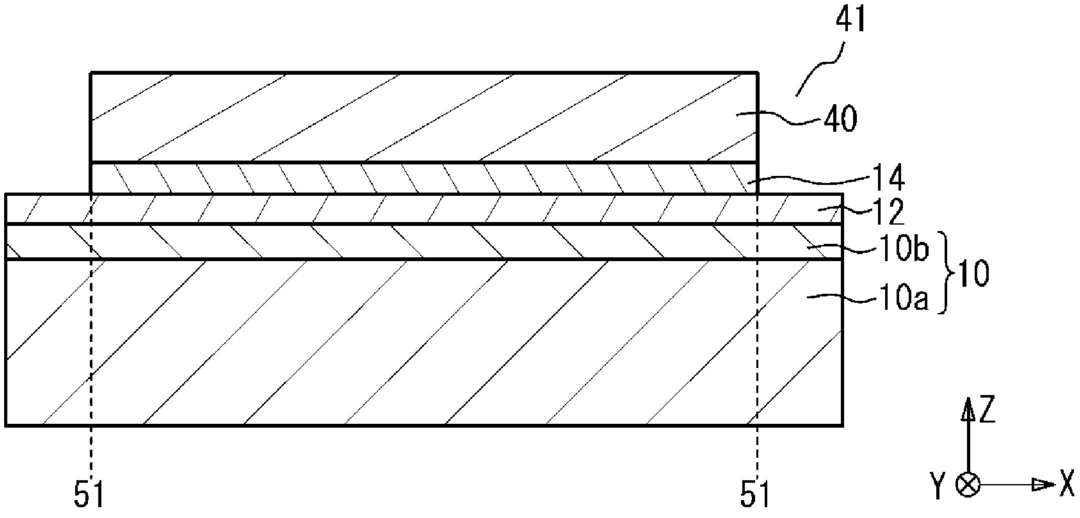
FIG. 3B is a cross-sectional view illustrating a method of manufacturing the capacitor according to the first embodiment.

FIGS. 3A to 7B are cross-sectional views illustrating a method of manufacturing the capacitor according to the first embodiment. As illustrated in FIG. 3A, the insulator film 12 is formed on the substrate 10. The first electrode 14 is formed on the insulator film 12. The first electrode 14 is formed using a sputtering method or a vacuum deposition method. As illustrated in FIG. 3B, a mask layer 40 having an opening 41 is formed on the first electrode 14. The mask layer 40 is made of, for example, photoresist and is formed by a photolithography method. The outer periphery of the opening 41 substantially matches the outer periphery 51 of the first electrode 14. Using the mask layer 40 as a mask, the first electrode 14 under the opening 41 is etched. Thus, the first electrode 14 having a desired shape is formed. Thereafter, the mask layer 40 is removed. The first electrode 14 may be formed by the vacuum deposition method and a lift-off method.

Figure 4A:
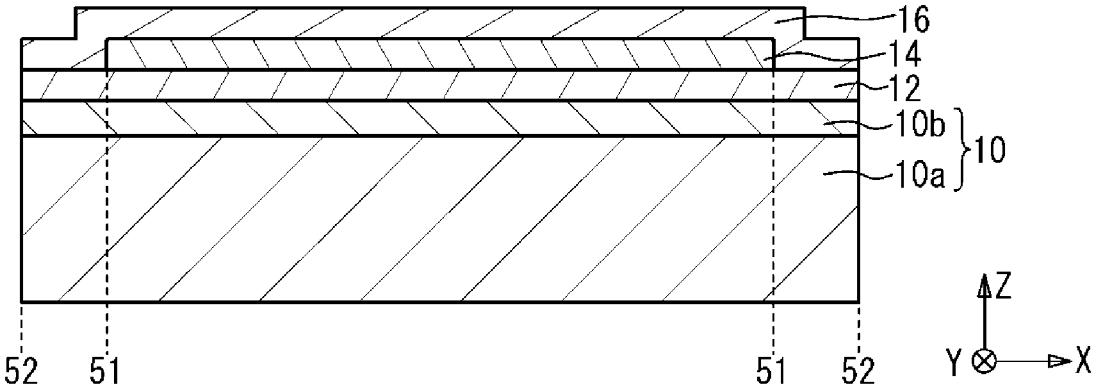
FIG. 4A is a cross-sectional view illustrating a method of manufacturing the capacitor according to the first embodiment.
Figure 4B:
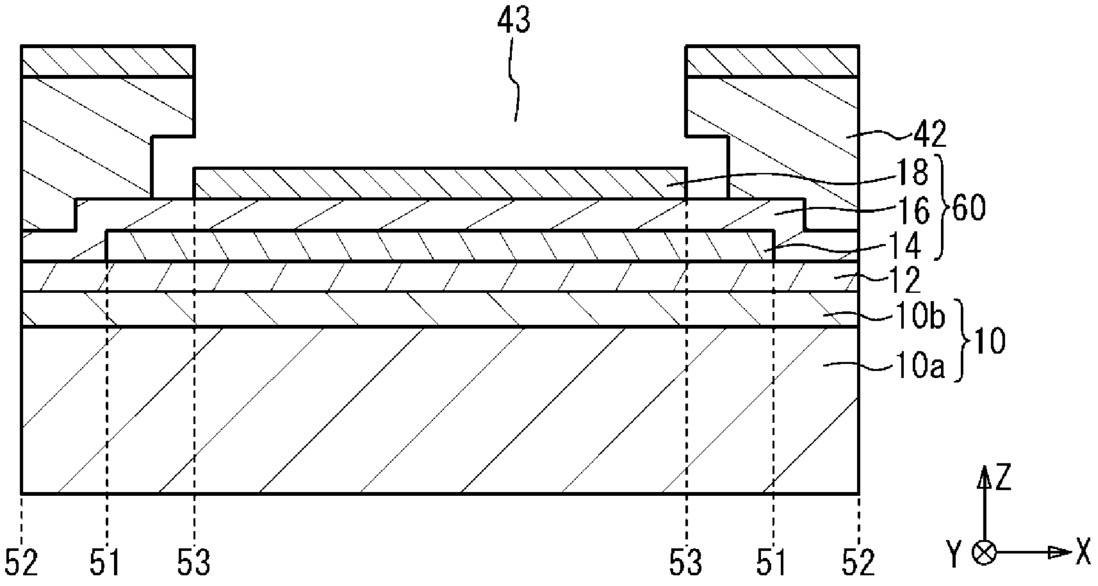
FIG. 4B is a cross-sectional view illustrating a method of manufacturing the capacitor according to the first embodiment.

As illustrated in FIG. 4A, the dielectric film 16 is formed on the insulator film 12 so as to cover the first electrode 14. The dielectric film 16 is formed using, for example, a CVD (Chemical Vapor Deposition) method. As illustrated in FIG. 4B, a mask layer 42 having an opening 43 is formed on the dielectric film 16. The width of the lower side of the opening 43 is larger than the width of the upper side thereof. The mask layer 42 is made of, for example, photoresist and is formed by the photolithography method. The outer periphery on the upper side of the opening 43 substantially matches the outer periphery 53 of the second electrode 18. A metal film is formed on the dielectric film 16 in the opening 43 and on the mask layer 42 using, for example, the vacuum deposition method. The metal film in the opening 43 becomes the second electrode 18. By removing the mask layer 42, the metal film on the mask layer 42 is lifted off. The MIM capacitor 60 is formed from the first electrode 14, the dielectric film 16 and the second electrode 18.

Figure 5A:
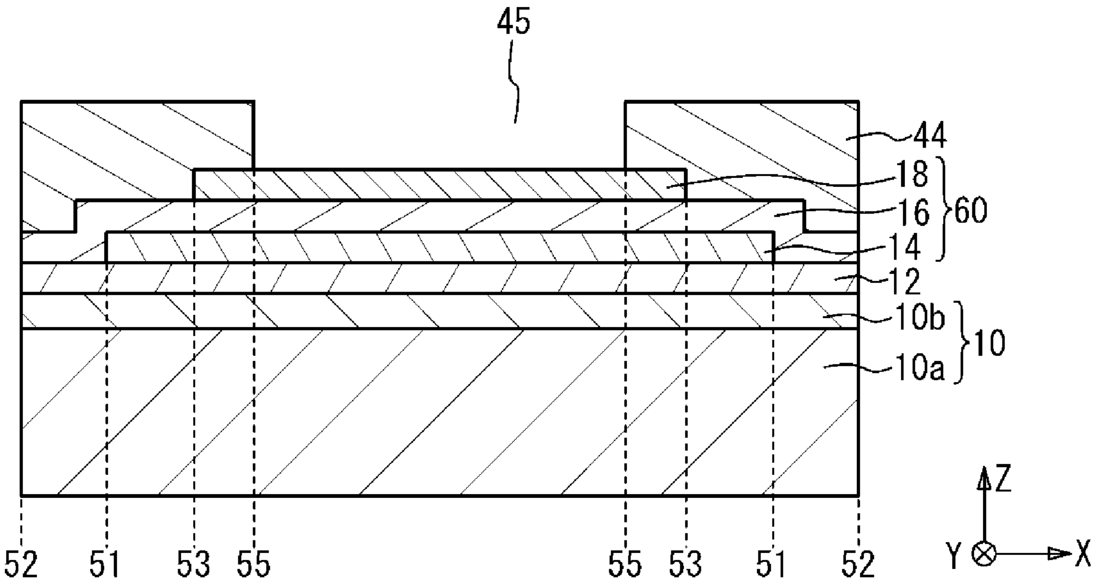
FIG. 5A is a cross-sectional view illustrating a method of manufacturing the capacitor according to the first embodiment.
Figure 5B:
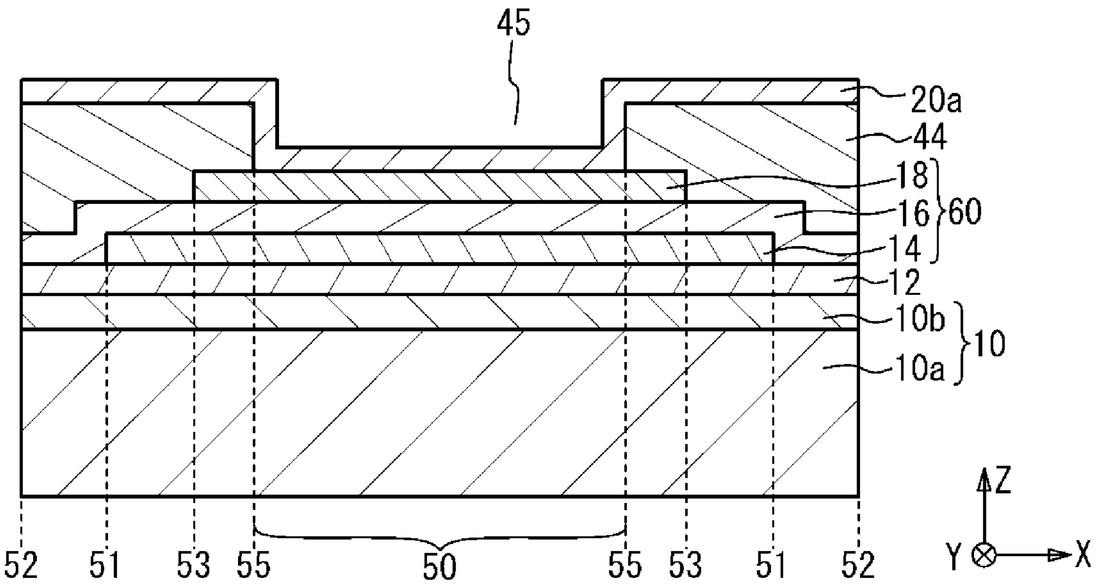
FIG. 5B is a cross-sectional view illustrating a method of manufacturing the capacitor according to the first embodiment.

As illustrated in FIG. 5A, a mask layer 44 having an opening 45 is formed on the dielectric film 16 and the second electrode 18. The mask layer 44 is made of, for example, photoresist and is formed by the photolithography method. The outer periphery of the opening 45 substantially matches the outer periphery 55 of the region 50. As illustrated in FIG. 5B, the seed layer 20*a* is formed on an inner surface of the opening 45 and on the mask layer 44. The seed layer 20*a* is formed using the sputtering method, for example. In the region 50, the seed layer 20*a* is in contact with the upper surface of the second electrode 18.

Figure 6A:
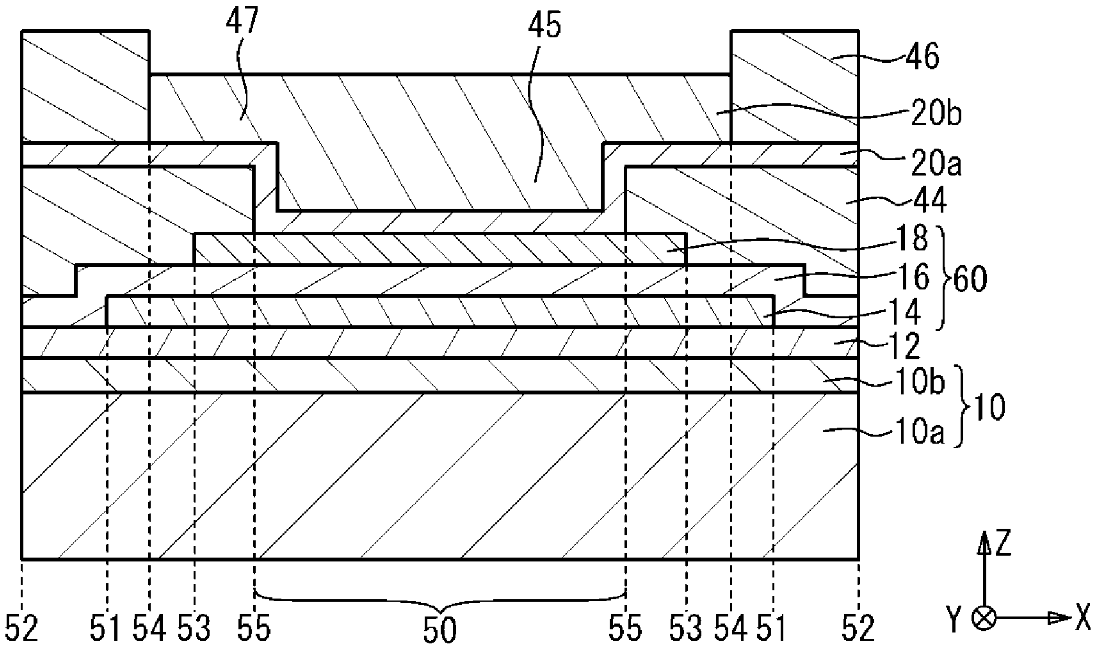
FIG. 6A is a cross-sectional view illustrating a method of manufacturing a capacitor according to the first embodiment.
Figure 6B:
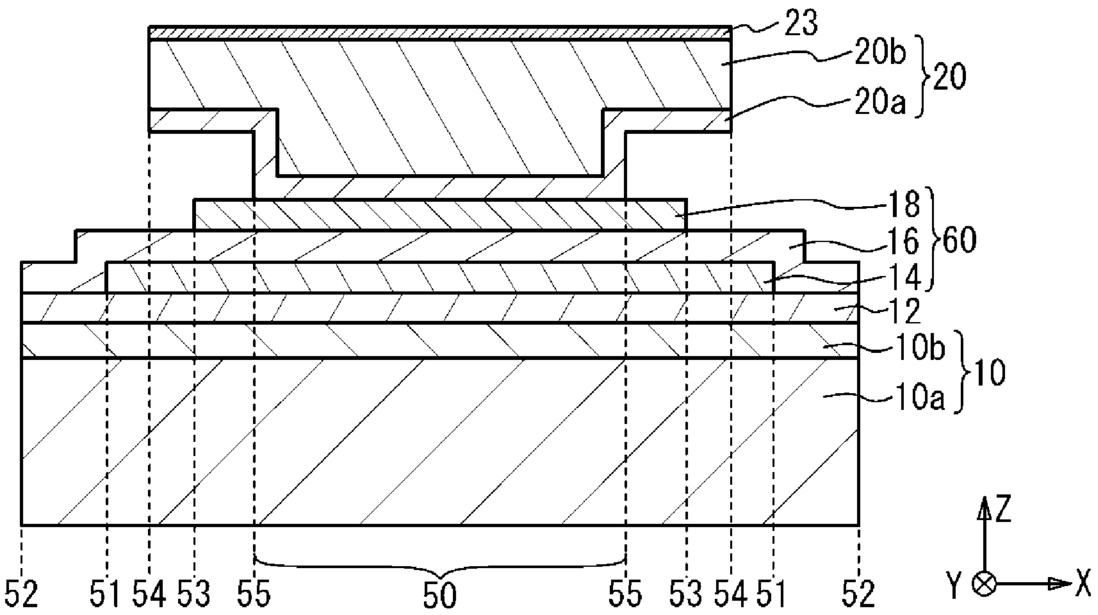
FIG. 6B is a cross-sectional view illustrating a method of manufacturing the capacitor according to the first embodiment.

As illustrated in FIG. 6A, a mask layer 46 having an opening 47 is formed on the seed layer 20*a*. The mask layer 46 is made of, for example, photoresist and is formed by the photolithography method. The outer periphery of the opening 47 substantially matches the outer periphery 54 of the third electrode 20. The plating layer 20*b* is formed in the opening 47. The plating layer 20*b* is formed by, for example, an electrolytic plating method in which a current is supplied from the seed layer 20*a*. As illustrated in FIG. 6B, the mask layer 46 is removed. To remove the mask layer 46, oxygen plasma treatment and/or stripping liquid treatment are used. Using the plating layer 20*b* as a mask, the seed layer 20*a* is removed. The seed layer 20*a* is removed by an etching method such as an ion milling method for irradiating the seed layer 20*a* with argon ions, for example. Thereafter, the mask layer 44 is removed. To remove the mask layer 44, the oxygen plasma treatment and/or the stripping liquid treatment are used. An unnecessary layer 23 is formed on the upper surface of the third electrode 20. The unnecessary layer 23 is an oxide layer or residue obtained by oxidizing the surface of the plating layer 20*b* of the third electrode 20 in the step of removing the mask layer 46, the seed layer 20*a*, and the mask layer 44.

Figure 7A:
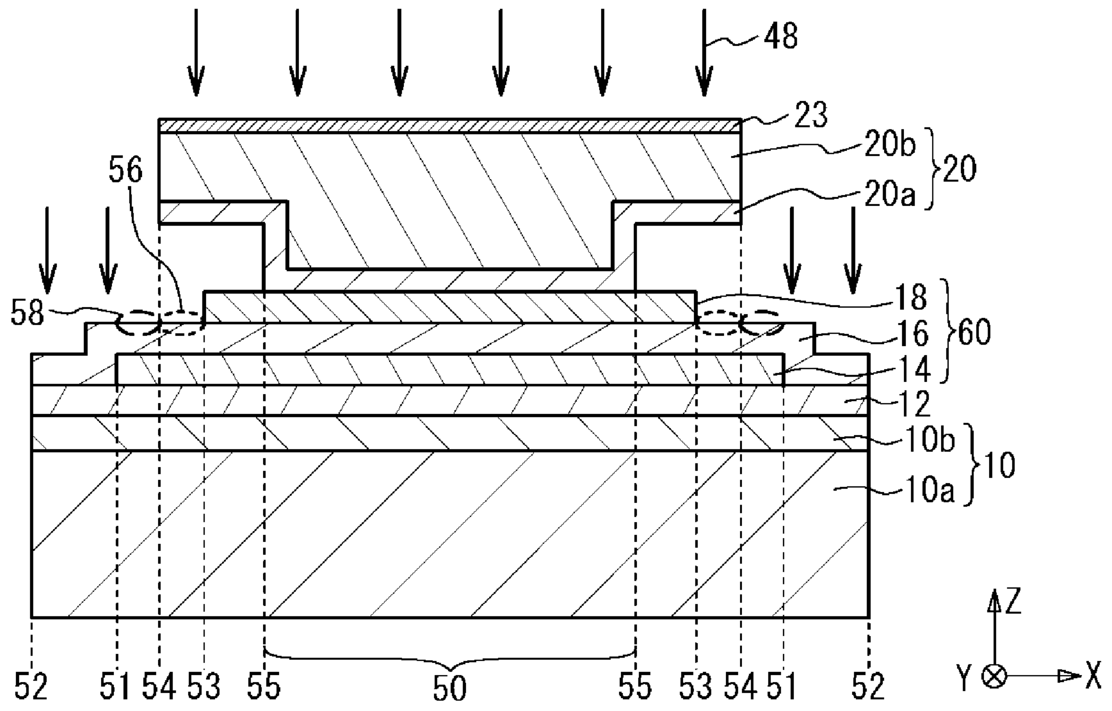
FIG. 7A is a cross-sectional view illustrating a method of manufacturing the capacitor according to the first embodiment.
Figure 7B:
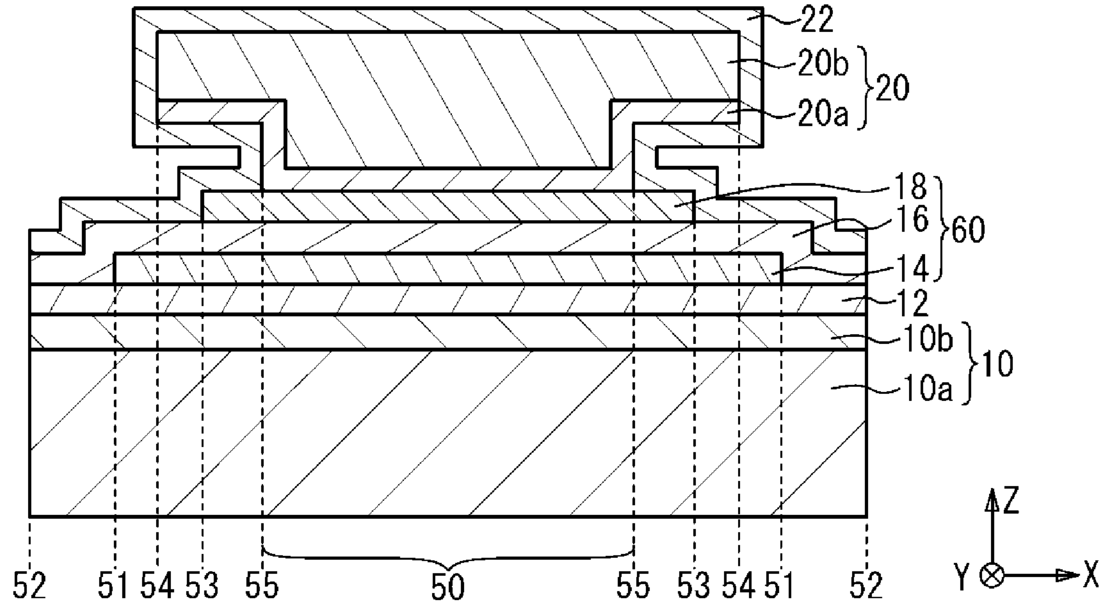
FIG. 7B is a cross-sectional view illustrating a method of manufacturing the capacitor according to the first embodiment.

As illustrated in FIG. 7A, the upper surface of the third electrode 20 is irradiated with ions 48. The ions 48 to be irradiated are 18th element ions such as argon. For the ion irradiation, for example, an ion milling method is used. Atoms may be irradiated instead of the ions 48. Thus, the unnecessary layer 23 on the upper surface of the third electrode 20 is removed. The upper surface of the dielectric film 16 in a region 56 directly under the eaves of the third electrode 20 is not irradiated with the ions 48. The ions 48 are irradiated on the upper surface of the dielectric film 16 in a region 58 outside the region 56. The unnecessary layer 23 may be removed by a method other than the method of irradiating ions or atoms. As illustrated in FIG. 7B, the protective film 22 is formed to cover the upper surface of the dielectric film 16, the upper surface of the second electrode 18, and the third electrode 20. The protective film 22 is formed by using a CVD method, for example. In FIG. 7A, the unnecessary layer 23 such as an oxide layer or a residue provided on the upper surface of the third electrode 20 is removed. Therefore, the adhesion between the third electrode 20 and the protective film 22 is improved. Thus, the capacitor according to the first embodiment is manufactured.

Figure 8:
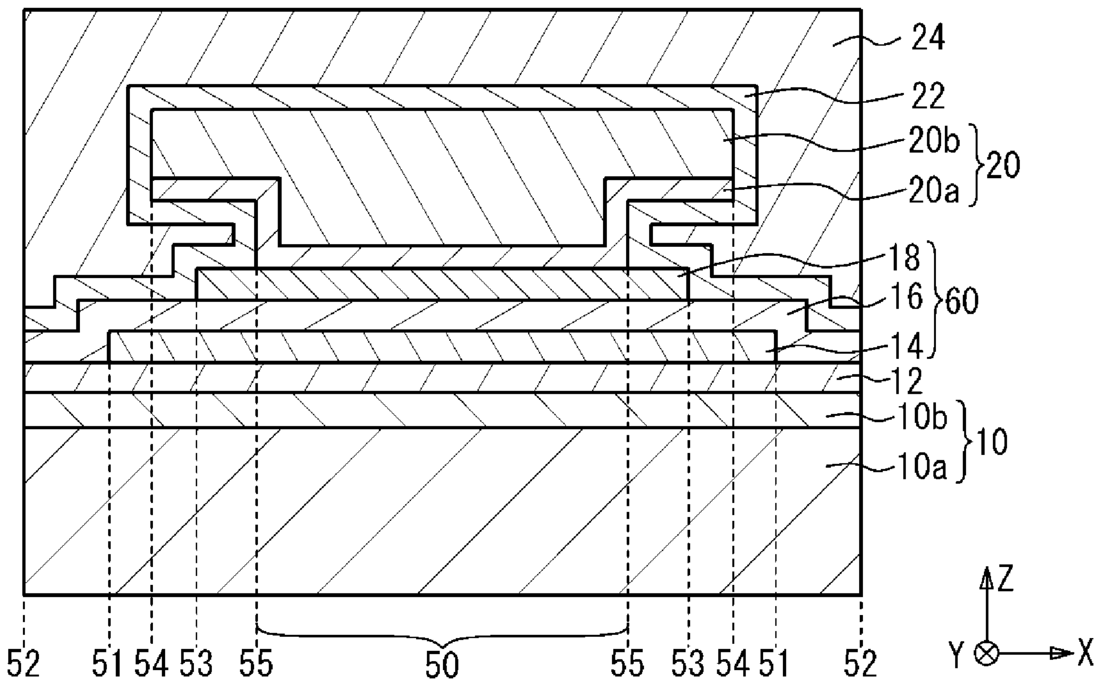
FIG. 8 is a cross-sectional view illustrating another example of the capacitor according to the first embodiment.

FIG. 8 is a cross-sectional view illustrating another example of the capacitor according to the first embodiment. As illustrated in FIG. 8, an insulator film 24 may be formed after FIG. 7B so as to cover the protective film 22. The insulator film 24 is made of, for example, polyimide or BCB resin.

First Comparative Example

Figure 9:
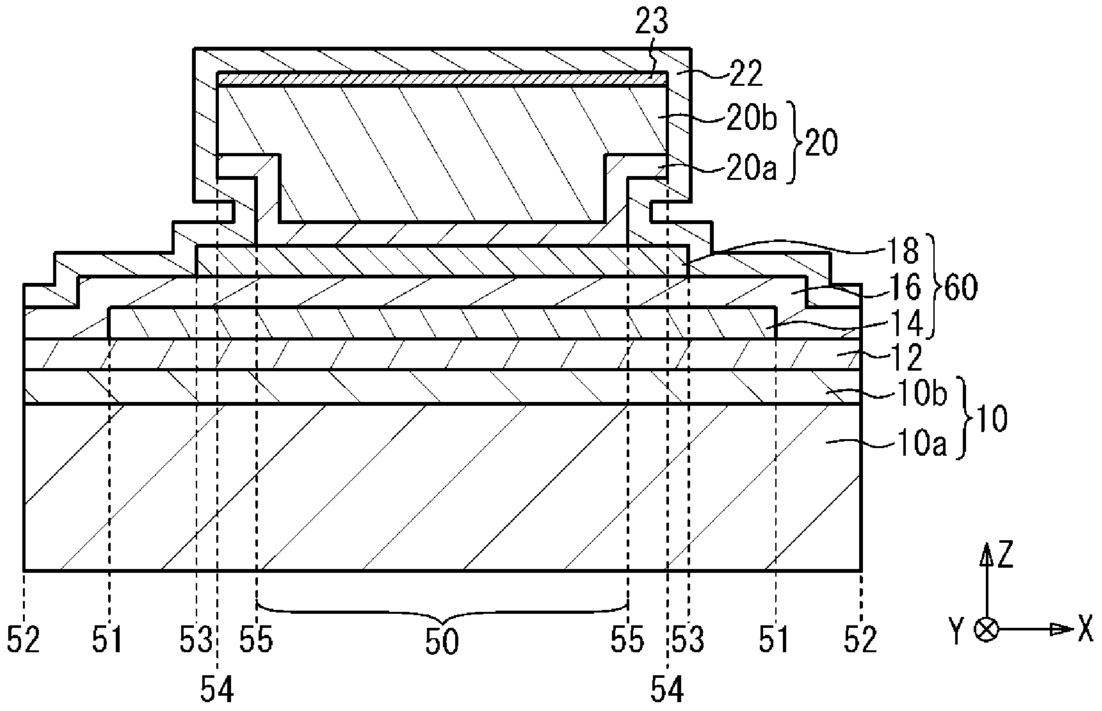
FIG. 9 is a sectional view of a capacitor according to a first comparative example.

FIG. 9 is a sectional view of a capacitor according to a first comparative example. In the first comparative example, the outer periphery 54 of the third electrode 20 is positioned inside the outer periphery 53 of the second electrode 18. In the first comparative example 1, the upper surface of the third electrode 20 is not irradiated with ions as illustrated in FIG. 7A. The unnecessary layer 23 is formed on the upper surface of the third electrode 20. When the unnecessary layer 23 is formed, the adhesion between the third electrode 20 and the protective film 22 reduces. Therefore, there is a possibility that the protective film 22 is separated from the third electrode 20.

[Manufacturing Method of Second Comparative Example]

Figure 10:
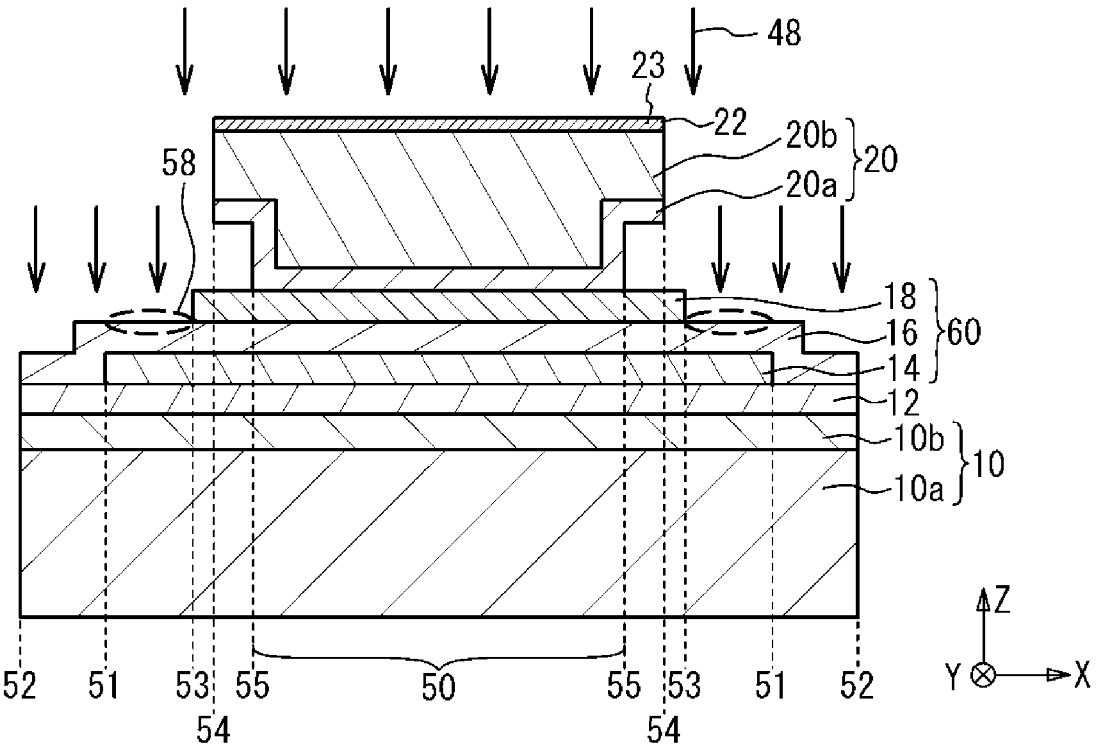
FIG. 10 is a cross-sectional view illustrating a method of manufacturing a capacitor according to a second comparative example.

FIG. 10 is a cross-sectional view illustrating a method of manufacturing a capacitor according to a second comparative example. As illustrated in FIG. 10, the upper surface of the third electrode 20 is irradiated with ions 48 in a state where the upper surface of the dielectric film 16 is exposed before the protective film 22 is formed. Thereby, the unnecessary layer 23 is removed, adhesion between the third electrode 20 and the protective film 22 is improved, and peeling of the protective film 22 can be suppressed. However, the ions 48 are irradiated onto the region 58 of the upper surface of the dielectric film 16 outside the second electrode 18. Thus, the dielectric film 16 is removed in the region 58. Alternatively, damage is introduced into the dielectric film 16. As described above, when damage or the like is introduced into the region 58 in contact with the second electrode 18, the breakdown voltage of the capacitor may reduce when a voltage is applied between the first electrode 14 and the second electrode 18.

[Manufacturing Method of Third Comparative Example]

Figure 11A:
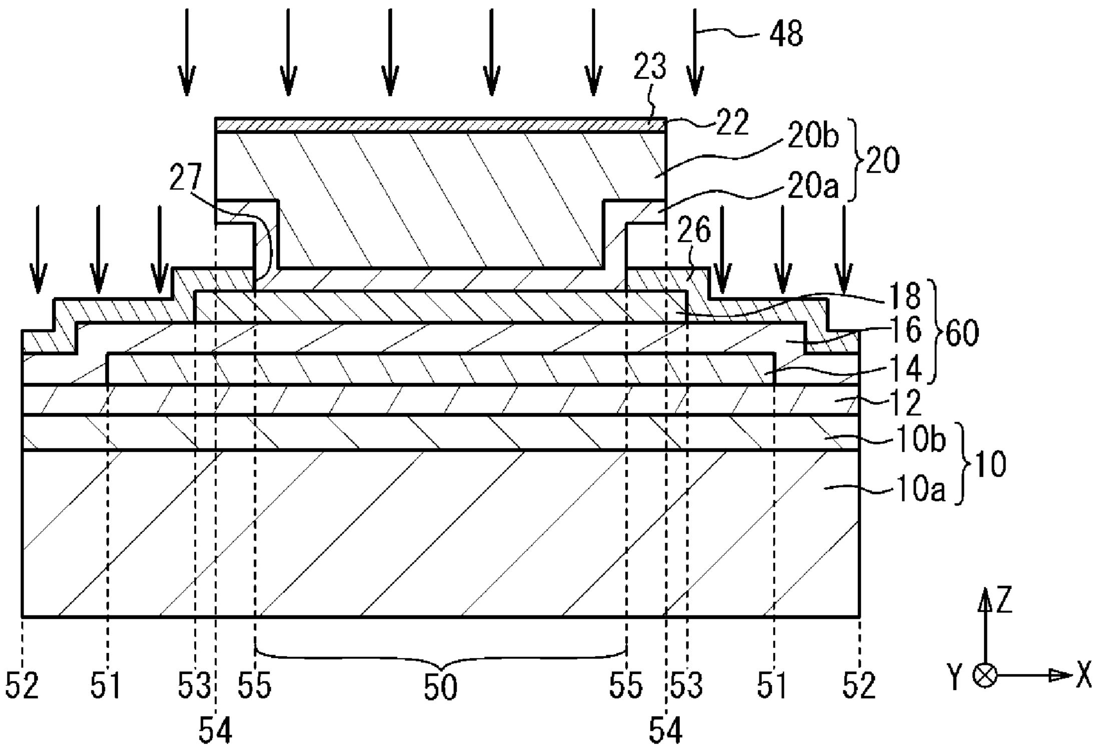
FIG. 11A is a cross-sectional view illustrating a method of manufacturing a capacitor according to a third comparative example.
Figure 11B:
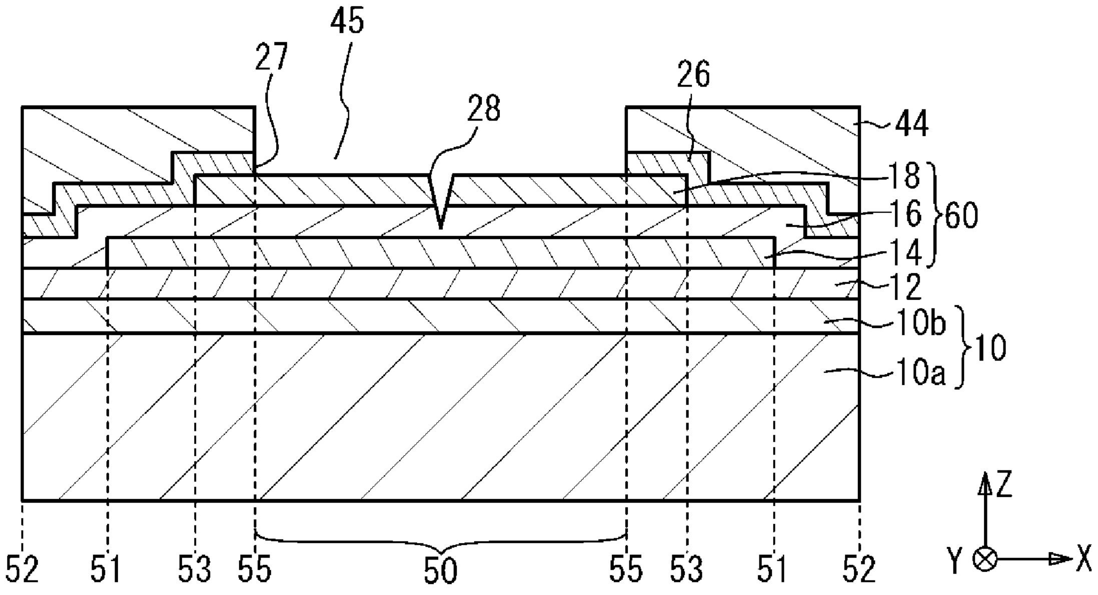
FIG. 11B is a cross-sectional view illustrating a method of manufacturing the capacitor according to the third comparative example.

FIGS. 11A and 11B are cross-sectional views illustrating a method of manufacturing a capacitor according to a third comparative example. As illustrated in FIG. 11A, an insulator film 26 is formed so as to cover the dielectric film 16 and the second electrode 18. The insulator film 26 is, for example, a silicon nitride film. The third electrode 20 is in contact with the second electrode 18 at an opening 27 of the insulator film 26. In the step of irradiating the upper surface of the third electrode 20 with the ions 48, the insulator film 26 is irradiated with the ions 48. As a result, the dielectric film 16 can be prevented from being irradiated with the ions 48 and from being damaged.

However, as illustrated in FIG. 11B, in order to form the opening 27 in the insulator film 26, the opening 27 is formed using the mask layer 44 as a mask in the process corresponding to FIG. 5A. When the second electrode 18 is formed by the vacuum deposition method, a mass (splash) of the vapor deposition material or the like scatters on the second electrode 18. When the mass is peeled off, the peeled-off region becomes a pinhole 28 of the second electrode 18. When the opening 27 is formed in the insulator film 26, an etchant for etching the insulator film 26 reaches the dielectric film 16 through the pinhole 28 to form a pinhole or a recess in the dielectric film 16. When the pinhole or the recess is formed in the dielectric film 16, the breakdown voltage of the MIM capacitor 60 reduces.

As in the first to the third comparative examples, when an attempt is made to suppress the peeling of the protective film 22, the breakdown voltage of the MIM capacitor 60 reduces.

In the first embodiment, in a plan view, the outer periphery 54 of the third electrode 20 is positioned inside the outer periphery 51 of the first electrode 14 and the outer periphery 52 of the dielectric film 16. The third electrode 20 is in contact with the second electrode 18 in the region 50 inside the second electrode 18 in the plan view, and is separated upward from the second electrode 18 and the dielectric film 16 outside the region 50 in the plan view. In such a structure, the outer periphery 54 of the third electrode 20 is positioned outside the outer periphery 53 of the second electrode 18 in the plan view. As illustrated in FIG. 7A, the unnecessary layer 23 formed on the upper surface of the third electrode 20 is removed in a state where the upper surface of the dielectric film 16 outside the outer periphery 53 of the second electrode 18 is exposed. After the unnecessary layer 23 is removed, the protective film 22 is formed so as to be in contact with and cover the dielectric film 16, the second electrode 18 and the third electrode 20.

In the capacitor thus manufactured, the outer periphery 54 of the third electrode 20 is positioned outside the outer periphery 53 of the second electrode 18 in the plan view. The protective film 22 is in contact with and covers the dielectric film 16, the second electrode 18 and the third electrode 20. Thus, as illustrated in FIG. 7A, when the unnecessary layer 23 is removed, the region 56 of the upper surface of the dielectric film 16 on the outside of the second electrode 18, which is directly under the third electrode 20, is shaded by the eaves of the third electrode 20. Therefore, the ions 48 are not irradiated to the region 56. The introduction of damage or the like into the dielectric film 16 can be suppressed in the region 56, and the reduction of the breakdown voltage of the MIM capacitor 60 can be suppressed. In the first embodiment, the upper surface of the dielectric film 16 in the region 58 outside the region 56 is irradiated with the ions 48. Since the region 58 and the second electrode 18 are separated from each other via the region 56, the breakdown voltage of the MIM capacitor 60 hardly reduces even if the upper surface of the dielectric film 16 is irradiated with the ions 48.

Figure 12:
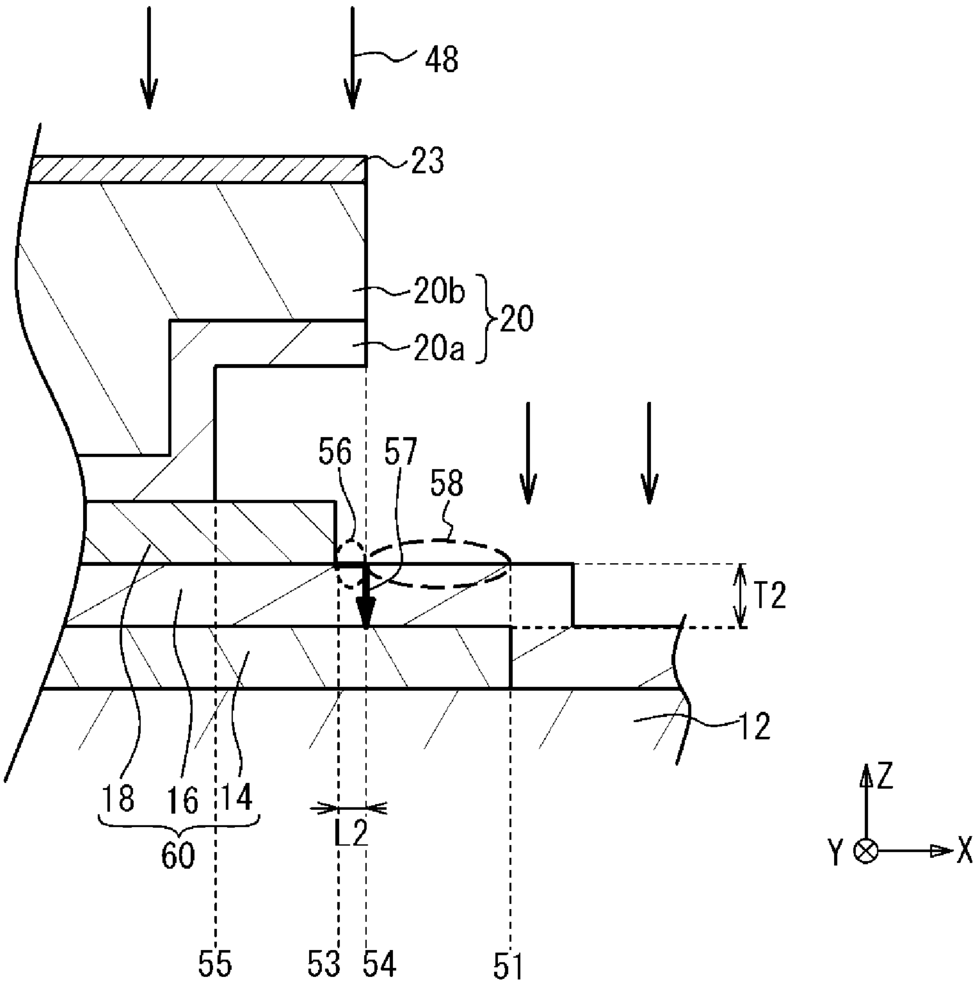
FIG. 12 is a cross-sectional view illustrating a method of manufacturing the capacitor according to the first embodiment.

FIG. 12 is an enlarged cross-sectional view illustrating a method of manufacturing the capacitor according to the first embodiment, and is an enlarged view in a process corresponding to FIG. 7A. As illustrated in FIG. 12, when the distance L2 between the outer periphery 54 of the third electrode 20 and the outer periphery 53 of the second electrode 18 in the plan view is short, the width in the X direction of the region 56 which is not irradiated with the ions 48 becomes narrow and the region 58 becomes closer to the second electrode 18. Thus, as indicated by an arrow 57, a path from the second electrode 18 to the first electrode 14 via the regions 56 and 58 and the dielectric film 16 is short, and there is a possibility that the breakdown voltage of the MIM capacitor 60 reduces. From this viewpoint, the distance L2 is preferably 0.5 times or more, more preferably 1 times or more, and still more preferably 2 times or more the thickness T2 of the dielectric film 16. From the viewpoint of manufacturing, the distance L2 is preferably 10 times or less the thickness of the dielectric film 16. In addition, the distance L2 is preferably 0.2 μm or more from the viewpoint of an alignment accuracy of the second electrode 18 and the third electrode 20.

Figure 13:
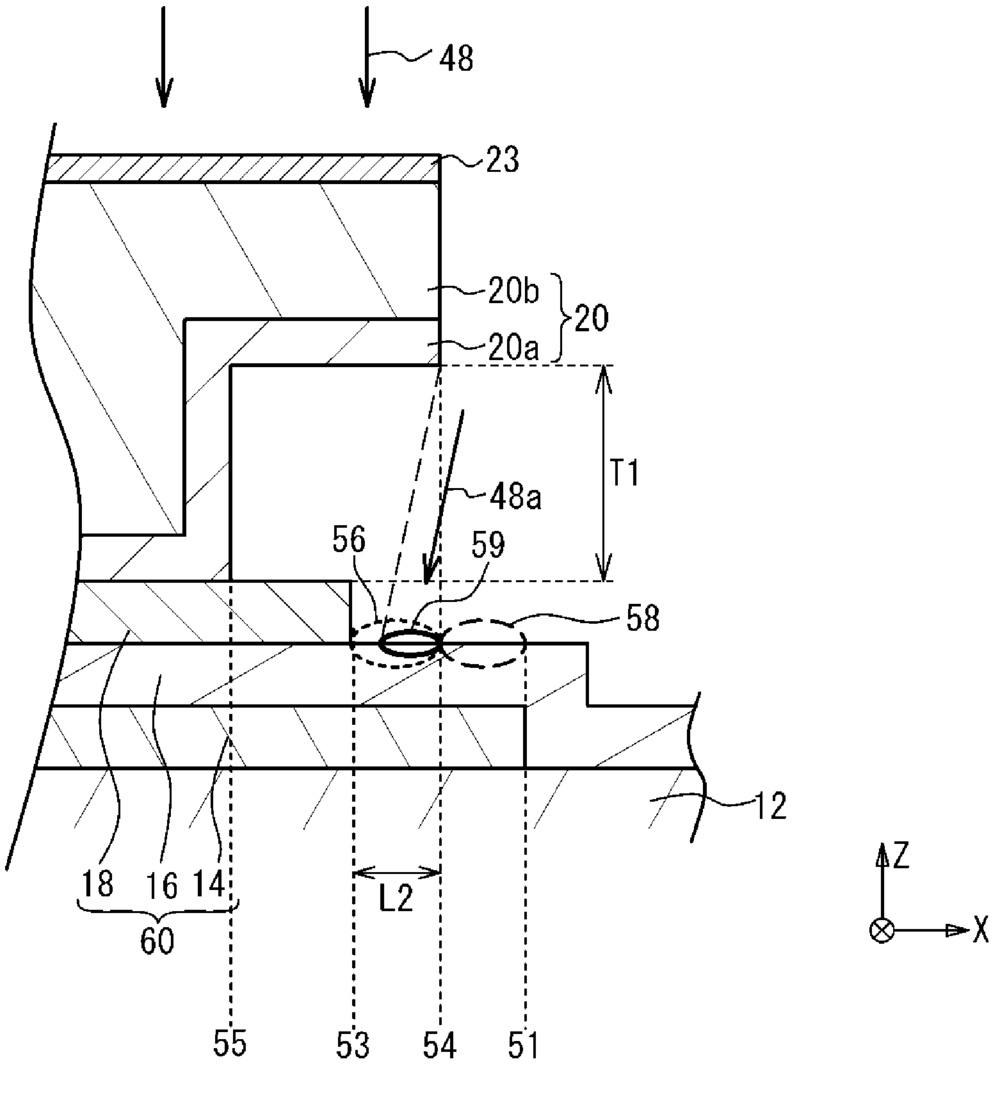
FIG. 13 is a cross-sectional view illustrating a method of manufacturing the capacitor according to the first embodiment.

FIG. 13 is an enlarged cross-sectional view illustrating a method of manufacturing the capacitor according to the first embodiment, and is an enlarged view in a process corresponding to FIG. 7A. As illustrated in FIG. 13, when the height T1 between the lower surface of the third electrode 20 and the upper surface of the second electrode 18 at the outer periphery 54 of the third electrode 20 as viewed from the X direction or the Y direction is large, there is a possibility that ions 48*a* enter the region 56 directly under the eaves of the third electrode 20. In a region 59 where the ions 48*a* have entered, damage or the like is introduced to the dielectric film 16 as in the region 58. When the region 59 is close to the second electrode 18, the breakdown voltage of the MIM capacitor 60 may reduce. The entry of ions 48 into the region 56 increases when the height T1 is large. From this viewpoint, the distance L2 is preferably 0.3 times or more, more preferably 0.5 times or more, and still more preferably 1 times or more the height T1. From the viewpoint of manufacturing, the distance L2 is preferably 3 times or less the height T1.

If the outer periphery 54 of the third electrode 20 is positioned too far outside, the protective film 22 is less likely to enter under the eaves of the third electrode 20. From this viewpoint, the height T1 between the outer periphery 54 of the third electrode 20 and the outer periphery 55 of the region 50 in the plan view is preferably 0.5 times or more, and more preferably 1 time or more the distance L3. The distance L3 is preferably, for example, 3 μm or less. From the viewpoint of manufacturing, the height T1 is preferably three times or less the distance L3.

In the first embodiment, since the insulator film 26 as illustrated in FIG. 11A of the third comparative example is not provided, the thickness of the protective film 22 on the third electrode 20 is substantially the same as the thickness of the protective film 22 on the second electrode 18 and the dielectric film 16. Thus, it is possible to suppress the breakdown voltage of the capacitor caused by the pinhole 28 as illustrated in FIG. 11B of the third comparative example.

As illustrated in FIG. 7A, as a step of removing the unnecessary layer 23, the ions or atoms are irradiated on the upper surface of the third electrode 20 in a state where the upper surface of the dielectric film 16 outside the outer periphery 53 of the second electrode 18 is exposed. Thus, the unnecessary layer 23 is removed. A traveling direction of ions or atoms is almost Z direction. When a degree of vacuum for irradiating the ions or atoms is sufficiently high, the ions or atoms move almost straight. Therefore, the region 56 is shaded by the eaves of the third electrode 20, and the ions or atoms are not easily irradiated to the region 56. Therefore, it is possible to suppress the dielectric film 16 in the region 56 from being shaved or to suppress damage from being introduced to the dielectric film 16.

In the step of forming the third electrode 20 illustrated in FIGS. 5A to 6B, the mask layer 44 (first mask layer) having the opening 45 (first opening) is formed on the second electrode 18 as illustrated in FIG. 5A. As illustrated in FIG. 5B, the seed layer 20*a* is formed on the inner surface of the opening 45 and the mask layer 44. As illustrated in FIG. 6A, the mask layer 46 (second mask layer) having the opening 47 (second opening) larger than the opening 45 is formed on the seed layer 20*a*. The plating layer 20*b* is formed in the opening 47. As illustrated in FIG. 6B, the mask layer 46 is removed, the seed layer 20*a* is removed using the plating layer 20*b* as the mask, and the mask layer 44 is removed. When the third electrode 20 is formed as described above, the third electrode 20 is in contact with the second electrode 18 in the region 50 inside the second electrode 18 upward from the second electrode 18 and the dielectric film 16 outside the region 50. Thus, when the third electrode 20 is formed, the third electrode 20 is in contact with the second electrode 18 in the region 50 and is separated upwardly from the first electrode 14 and the dielectric film 16 outside the region 50. The third electrode 20 includes the seed layer 20*a* provided on the second electrode 18, and the plating layer 20*b* provided on the seed layer 20*a*. Further, in the step of removing the mask layer 46, the seed layer 20*a* and the mask layer 44, the unnecessary layer 23 is formed on the upper surface of the third electrode 20. Here, it is preferable to remove the unnecessary layer 23 by irradiating the third electrode 20 with the ions or atoms as illustrated in FIG. 7A.

In the first embodiment, there has been described the reduction in the breakdown voltage of the capacitor caused by damage or the like introduced into the dielectric film 16 in the process of removing the unnecessary layer 23. The damage or the like to the dielectric film 16 may be introduced in a step other than the step of removing the unnecessary layer 23. In such a case, the breakdown voltage of the capacitor may be reduced due to the damage or the like introduced into the dielectric film 16. When the damage or the like is introduced to the dielectric film 16 in the steps of FIGS. 6A to 7B, the introduction of damage or the like to the upper surface of the dielectric film 16 in contact with the second electrode 18 can be suppressed by providing the outer periphery 54 of the third electrode 20 outside the outer periphery 53 of the second electrode 18, and the breakdown voltage of the capacitor can be improved.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A capacitor comprising:
- a substrate;
- a first electrode provided on the substrate;
- a dielectric film provided on the first electrode;
- a second electrode provided on the dielectric film and having an outer periphery positioned inside the outer periphery of the first electrode in a plan view viewed from above in a direction normal to an upper surface of the substrate;
- a third electrode that is in contact with the second electrode; and
- a protective film covering the second electrode and the third electrode and being in contact with the second electrode and the third electrode,
- wherein a thickness of the protective film on the third electrode is the same as that of the protective film on the second electrode,
- wherein in the plan view, a lower surface of the third electrode contacts the second electrode in an inner region of the second electrode, and an upper surface of the third electrode has an outer periphery located outside an outer periphery of the second electrode and located inside the outer periphery of the first electrode and the outer periphery of the dielectric film, and
- wherein in a cross-sectional view, the upper surface of the third electrode is spaced upward from the outer surface of the second electrode.

2. The capacitor according to claim 1, wherein
- a distance between the outer periphery of the third electrode and the outer periphery of the second electrode in the plan view is 0.5 times or more a thickness of the dielectric film.

3. The capacitor according to claim 1, wherein
- a distance between the outer periphery of the third electrode and the outer periphery of the second electrode in the plan view is 0.3 times or more a height between the outer periphery of a lower surface of the third electrode parallel to the upper surface of the substrate and an upper surface of the second electrode as viewed from a plane direction of the upper surface of the substrate.

4. The capacitor according to claim 1, wherein
- a height of the outer periphery of the lower surface of the third electrode parallel to the upper surface of the substrate and the upper surface of the second electrode as viewed from a plane direction of the upper surface of the substrate is 0.5 times or more a distance between the outer periphery of the third electrode and an outer periphery of the inner region in the plan view.

5. The capacitor according to claim 1, wherein
- the third electrode includes a seed layer provided on the second electrode and a plating layer provided on the seed layer.

6. The capacitor according to claim 1, wherein
- in the cross-sectional view, a length of the lower surface of the third electrode being smaller than a length of the upper surface of the third electrode.

7. A method of manufacturing a capacitor comprising:
- forming a first electrode on a substrate;
- forming a dielectric film on the first electrode;
- forming a second electrode on the dielectric film, the second electrode having an outer periphery positioned inside the outer periphery of the first electrode in a plan view viewed from above in a direction normal to an upper surface of the substrate;
- forming a third electrode that is in contact with the second electrode in a region inside the second electrode in the plan view, is separated upward from the second electrode and the dielectric film outside the region in the plan view, and has an outer periphery positioned inside the outer periphery of the first electrode and an outer periphery of the dielectric film in the plan view;
- removing an unnecessary layer formed on an upper surface of the third electrode in a state where an upper surface of the dielectric film outside the outer periphery of the second electrode in the plan view is exposed; and
- forming a protective film covering the second electrode and the third electrode and being in contact with the second electrode and the third electrode after removing the unnecessary layer, and wherein a thickness of the protective film on the third electrode is the same as that of the protective film on the second electrode.

8. The method of manufacturing the capacitor according to claim 7, wherein
- the removing the unnecessary layer includes irradiating an upper surface of the third electrode with ions or atoms in the state where the upper surface of the dielectric film outside the outer periphery of the second electrode in the plan view is exposed.

9. The method of manufacturing the capacitor according to claim 8, wherein
- the forming the third electrode includes:
  - forming a first mask layer having a first opening on the second electrode;
  - forming a seed layer on an inner surface of the first opening and on the first mask layer;
  - forming a second mask layer having a second opening larger than the first opening on the seed layer;
  - forming a plating layer in the second opening;
  - removing the second mask layer;
  - removing the seed layer using the plating layer as a mask; and
  - removing the first mask layer.

10. A capacitor comprising:

a substrate;

a first electrode provided on the substrate;

a dielectric film provided on the first electrode;

a second electrode provided on the dielectric film and having an outer periphery positioned inside the outer periphery of the first electrode in a plan view viewed from above in a direction normal to an upper surface of the substrate; and a third electrode that is in contact with the second electrode, wherein in the plan view, a lower surface of the third electrode contacts the second electrode in an inner region of the second electrode, and an upper surface of the third electrode has an outer periphery located outside an outer periphery of the second electrode and located inside the outer periphery of the first electrode and the outer periphery of the dielectric film, wherein in a cross-sectional view, the upper surface of the third electrode is spaced upward from the outer surface of the second electrode, and wherein a distance between the outer periphery of the third electrode and the outer periphery of the second electrode in the plan view is 0.3 times or more a height between the outer periphery of a lower surface of the third electrode parallel to the upper surface of the substrate and an upper surface of the second electrode as viewed from a plane direction of the upper surface of the substrate.

11. A capacitor comprising:

a substrate;

a first electrode provided on the substrate;

a dielectric film provided on the first electrode;

a second electrode provided on the dielectric film and having an outer periphery positioned inside the outer periphery of the first electrode in a plan view viewed from above in a direction normal to an upper surface of the substrate; and a third electrode that is in contact with the second electrode, wherein in the plan view, a lower surface of the third electrode contacts the second electrode in an inner region of the second electrode, and an upper surface of the third electrode has an outer periphery located outside an outer periphery of the second electrode and located inside the outer periphery of the first electrode and the outer periphery of the dielectric film, wherein in a cross-sectional view, the upper surface of the third electrode is spaced upward from the outer surface of the second electrode, and wherein a height of the outer periphery of the lower surface of the third electrode parallel to the upper surface of the substrate and the upper surface of the second electrode as viewed from a plane direction of the upper surface of the substrate is 0.5 times or more a distance between the outer periphery of the third electrode and an outer periphery of the inner region in the plan view.

* * * * *